United States Patent
Song et al.

(10) Patent No.: US 7,582,537 B2
(45) Date of Patent: Sep. 1, 2009

(54) ZENER DIODE AND METHODS FOR FABRICATING AND PACKAGING SAME

(75) Inventors: Ki Chang Song, Uiwang-si (KR); Geun Ho Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 495 days.

(21) Appl. No.: 11/295,453

(22) Filed: Dec. 7, 2005

(65) Prior Publication Data

US 2006/0125053 A1  Jun. 15, 2006

(30) Foreign Application Priority Data

Dec. 15, 2004  (KR) .................. 10-2004-0106641
Jul. 29, 2005  (KR) .................. 10-2005-0069539

(51) Int. Cl.
*H01L 21/20*  (2006.01)

(52) U.S. Cl. ................. 438/380; 438/532; 438/555

(58) Field of Classification Search .......... 257/603, 257/E25.032, E29.335, E33.006, E33.062; 438/380, 555, 942, 527, 532, 533, 564, 983
See application file for complete search history.

(56) References Cited

U.S. PATENT DOCUMENTS 4,127,859 A  11/1978  Nelson 6,665,170 B1  12/2003  Warner
6,791,161 B2 *  9/2004  Hamerski ................. 257/603
6,861,677 B2 *  3/2005  Chen ........................ 257/99
2003/0038332 A1 *  2/2003  Kimura ..................... 257/467

FOREIGN PATENT DOCUMENTS

| DE | 4244115 | 7/1993 |
| EP | 0 272 184 | 6/1988 |
| EP | 0159 129 | 6/1990 |
| JP | 64-001284 | 1/1989 |
| JP | 2004-179572 | 6/2004 |
| WO | WO 97/41602 | 11/1997 |

OTHER PUBLICATIONS

Chinese Office Action dated Dec. 28, 2007.
European Search Report dated Mar. 19, 2009.

* cited by examiner

*Primary Examiner*—Thomas L Dickey
*Assistant Examiner*—Fazli Erdem
(74) *Attorney, Agent, or Firm*—Ked & Associates LLP

(57) ABSTRACT

A zener diode and methods for fabricating and packaging same are disclosed, whereby contact hole forming process exposing a diffusion layer is removed to enable to simplify the fabricating process, and the diffusion length not contacting the electrode line is determined by the crosswise length toward which the impurity is diffused to enable to reduce the zener impedance value. Furthermore, wet etching is used following the diffusion to remove the diffusion masks such that no damage is given to the diffusion layers to thereby enable to improve the zener diode characteristics.

14 Claims, 9 Drawing Sheets

ZENER DIODE AND METHODS FOR FABRICATING AND PACKAGING SAME

BACKGROUND OF THE INVENTION

1. Field

This document relates to a zener diode and methods for fabricating and packaging same.

2. Description of the Related Art

In general, there is a disadvantage in a device having a low voltage-resistance out of semiconductor devices in that its life span is shortened due to static electricity or surge voltage generated during implementation of measurement or packaging process. As a protective device against the low voltage-resistance, a zener diode is used.

The zener diode is a diode using a reverse breakdown voltage, and a reverse breakdown of PN zener diode includes a zener breakdown occurring at a low threshold voltage, and an avalanche breakdown occurring at a higher threshold voltage.

The zener breakdown is configured in such a manner that, if an impurity of high concentration is introduced into a semiconductor layer, a charge depletion layer of narrow width is formed to result in generation of a high electric field even at a low voltage.

In other words, if the impurity of high concentration is doped, energy bands are entwined even at a reverse-biased low voltage such that an energy band of valence electro band of P type semiconductor layer forms a higher energy level than that of the conductivity band of N type semiconductor layer.

If the width of the charge depletion layer is narrow, electrons filled in P type valence electron band generate tunneling breakdown toward N type conductivity band resulting in a diode of a very low resistance with a high current flowing therein.

A diode so fabricated as to generate a zener breakdown using the afore-mentioned principle is called a zener diode. If a reverse voltage applied to the diode reaches the zener breakdown voltage, reverse current suddenly increases to a great extent, but terminal voltage remains constant such that the diode can be used as a constant voltage diode.

Meanwhile, if a reverse surge voltage occurs in a device, for example, a light emitting diode (LED) having a low voltage-resistant characteristic, an excessive charge flows into the semiconductor layer to damage or deteriorate the LED.

These problems can be further worsened if devices are fabricated on top of an insulation substrate. The surge voltage may rise up to thousands of voltages such that protective devices must be separately installed if internal voltage (allowable voltage) of the device is low.

Therefore, the zener diode used for diodes having a low voltage-resistant characteristic and having a predetermined breakdown voltage may be used in the form of a PN zener diode (zener breakdown generated only in reverse direction), or in the form of a zener diode having a bi-directional threshold voltage characteristic where two zener diodes are connected in series in the same polarity direction (PNP or NPN) to cause a zener breakdown to occur at both regions in the forward and reverse directions.

When a zener diode having a bi-directional threshold voltage characteristic is connected to a device such as LED, the zener diode may be connected to a device for improving voltage-resistance in parallel regardless of polarity because polarity of two terminals of the zener diode is identical.

Consequently, if a surge voltage occurs in a device of low voltage-resistance connected to the zener diode, an over-current of any kind does not flow toward the low voltage-resistant device but bypasses toward the zener diode having a low resistant value because a zener breakdown occurs near a zener voltage, thereby enable to protect the device.

FIGS. 1a through 1h are cross-sectional view describing a fabricating process of a zener diode according to the prior art.

First of all, top and lower mask layers (11.12) are formed with top and bottom surfaces of N type semiconductor substrate (10), the top mask layer (11) is selectively etched and allowed to be mutually spaced apart, and a pair of openings (11a. 11b) are formed exposing the N type semiconductor substrate (10). (FIG. 1a)

Next, referring to FIG. 1b, when P type impurities are introduced into the top and bottom surfaces of the substrate (10) and diffusion process is conducted, P type diffusion layers (10a. 10b) are formed on the N type semiconductor substrate (10) region exposed to the openings (11a. 11b) of the top mask layer (11).

The top and bottom mask layers (11.12) are formed with property-changed layers (11a. 12a), and surfaces of the diffusion layers (10a. 10b) are formed with isolation layers (10Aa. 10Bb). For example, in case of a source for diffusion process being boron (B), the isolation layers (10Aa. 10Bb) are boron glass layers.

Successively, the mask layers (11.12), the property-changed films (11a. 12a) and the isolation layers (10Aa. 10Bb) are removed. (FIG. 1c)

Now, an isolation film (15) formed with contact holes (15a. 15b) exposing the diffusion layers (10a. 10b) is formed on the top of the substrate (10). (FIG. 1d)

Lastly, a pair of electrode lines (16a. 16b) electrically connecting each diffusion layer (10a. 10b) are formed via the contact holes (15a. 15b). (FIG. 1e)

When a zener diode having a bi-directional threshold voltage characteristic is formed by the method described earlier, an inter-layer insulation film should be vapor-deposited, the inter-layer insulation film should be etched to form a contact hole for connecting the diffusion layers to the electrodes. However, if a contact hole is formed at a region unwanted by the contact hole forming process, a PN zener diode or a resistant body, not a zener diode having a bi-directional threshold voltage characteristic, is formed to lower a yield thereof.

There is another problem in that a current has to flow across a long diffusion layer to increase a zener impedance because the current flows from an electrode line to a diffusion layer and substrate, and flows through another diffusion layer and the other electrode line.

There is still further problem in that a diffusion layer not contacting an electrode line exists due to limitation of contact hole forming process, and the diffusion layer and the electrode line are not self-aligned to result in a deteriorated reliability.

There is still further problem in that if the contact hole is formed by using dry etching, the diffusion layer is damaged by the dry etching to result in a deteriorated characteristic of zener diode.

FIG. 2 is a conceptual diagram illustrating a phenomenon where a zener impedance value is increased in the prior art of FIGS. 1a through 1e.

As mentioned earlier, in order to form the insulation film (11) and selectively etch the insulation film (11) and to form the contact hole (15a) where top of the diffusion layer (10a) is exposed, following the formation of the diffusion layer (10a), width (W1) of the contact hole (15a) should be smaller than that (W2) of the diffusion layer (10a), and a gap 'd' from a lateral wall of the contact hole (15a) and a marginal proximity of the diffusion layer (10a) should be maintained. The 'd' value is larger than a preset value because operational error and distribution of the diffusion layer (10a) should be taken into account.

Therefore, as the gap of 'd' is increased, the current flow at the diffusion layer is lengthened to thereby increase a zener impedance value in the zener diode fabricating process according to the prior art.

FIGS. 3a through 3d are cross-sectional views illustrating a fabricating process of a zener diode according to the prior art.

Top and lower mask layers (11.12) are formed with top and bottom surfaces of P type semiconductor substrate (10), the top mask layer (11) is selectively etched and allowed to be mutually spaced apart, and a pair of openings (11a. 11b) are formed exposing the N type semiconductor substrate (10). (FIG. 3a)

Next, referring to FIG. 3b, when N type impurities are introduced into the top and bottom surfaces of the substrate (10) and diffusion process is conducted, N type diffusion layers (10a. 10b) are formed on the P type semiconductor substrate (10) region exposed through the openings (11a. 11b) of the top mask layer (11).

At this time, the top and bottom mask layers (11.12) are formed with property-changed layers (11a. 12a) due to the diffusion process as illustrated in FIGS. 1a and 1b, and surfaces of the diffusion layers (10a. 10b) are formed with insulation films (10aA. 10bB).

Successively, the insulation films (10aA. 10bB) are centrally removed. (FIG. 1c) to expose the diffusion layers (10a.10b). (FIG. 3c)

Lastly, a pair of electrode lines (16a. 16b) electrically connected to each diffusion layer (10a. 10b) are formed. (FIG. 3d)

There is a problem in the process according to the prior art in that, although there is no evaporating process of inter-layer insulation films, the films property-changed at the diffusion mask used for inter-layer insulation films become a cause generating leaked current at the electrode lines, and degrading the characteristics.

There is another problem in that a current flows across the long diffusion layer as described in FIG. 1 of fabricating method to increase the zener impedance value, and if the contact holes are formed using the dry etching, the diffusion layers are damaged by the dry etching to deteriorate the zener diode characteristics.

SUMMARY OF THE INVENTION

The present invention is disclose to solve the afore-mentioned problems, and it is an object of the present invention to provide a zener diode and methods for fabricating and packaging same configured to remove a contact hole forming process exposing the diffusion layers enabling to simplify the process, and reducing a zener impedance value by determining a length of a diffusion layer not contacting an electrode line by a horizontal length of diffused impurity.

It is another object of the present invention to provide a zener diode and methods for fabricating and packaging same configured to remove a diffusion mask using wet etching following diffusion, enabling to inflict no damage to diffusion layers and thereby improving the zener diode characteristics.

It is still another object of the present invention to provide a zener diode and methods for fabricating and packaging same configured to use a diffusion layer as an inter-layer insulation film, improving an electrical isolation characteristic between a diffusion layer and a metal line and allowing the diffusion mask and diffusion layer to be self-aligned.

In accordance with a first aspect of the present invention, a zener diode fabricating method comprises: sequentially forming insulation films and mask layers on top and bottom of a substrate having a first polarity; sequentially etching part of the mask layer on top of the substrate and the insulation film to form a pair of openings through which the substrate is exposed; implementing a diffusion process by introducing an impurity having a second polarity opposite to that of the first polarity into the substrate to form diffusion layers having the second polarity at a substrate region exposed through a pair of openings; removing the mask layer on top of the substrate to expose the insulation film, and exposing the mutually spaced diffusion layers through the openings of the insulation film; and forming a pair of electrode lines each electrically connected to the exposed diffusion layers.

In accordance with a second aspect of the present invention, a zener diode fabricating method comprises: sequentially forming an insulation film and a mask layer on top and bottom of a substrate having a first polarity; sequentially etching part of the mask layer on top of the substrate and the insulation film to form an opening through which the substrate is exposed; implementing a diffusion process by introducing an impurity having a second polarity opposite to that of the first polarity into the substrate to form diffusion layers having the second polarity at a substrate region exposed by the opening; removing the mask layer on top of the substrate to expose the insulation film, and exposing the diffusion layers through the opening of the insulation film; etching an insulation film spaced apart from the opening to form another opening through which the substrate is exposed; forming on top of the insulation film a pair of electrode lines each electrically connected to the diffusion layers exposed through the openings and the substrate; and forming a pair of electrode lines each electrically connected to the exposed diffusion layers.

In accordance with a third aspect of the present invention, a zener diode fabricating method comprises: sequentially forming an insulation film and a mask layer on top and bottom of a substrate having a first polarity, sequentially etching part of the mask layer and the insulation film to form a pair of openings through which the substrate is exposed, forming diffusion layers having a second polarity on a substrate region through which a pair of openings are exposed, removing the mask layer on top of the substrate to expose the insulation film and exposing the mutually spaced diffusion layers through the openings of the insulation film, and forming a pair of electrode lines each electrically connected to the exposed diffusion layers to fabricate a device; preparing a Printed Circuit Board (PCB) packaged with first and second electrode terminals thereon and a Light Emitting Device (LCD) formed thereon, bonding the device to top of the PCB; wire-bonding a first electrode terminal of the PCB to an electrode line of the device, wire-bonding an electrode line of the device to an electrode terminal of the LED, wire-bonding a second electrode terminal of the PCB to the other electrode terminal of the LED, and wire-bonding the other electrode terminal of the LED to the other electrode line of the device.

In accordance with a fourth aspect of the present invention, a zener diode packaging method comprises: sequentially forming an insulation film and a mask layer on top and bottom of a substrate having a first polarity, sequentially etching part of the mask layer and the insulation film to form a pair of openings through which the substrate is exposed, forming diffusion layers having a second polarity on a substrate region through which a pair of openings are exposed, removing the mask layer on top of the substrate to expose the insulation film and exposing the diffusion layers through the openings of the insulation film, and forming a pair of electrode lines each electrically connected to the exposed diffusion layers to fabricate a device; packaging the device to a Printed Circuit Board (PCB) formed thereon with first and second electrode terminals; flip-chip bonding a Light Emitting Device (LED) to two electrode lines of the device; and wire-bonding the first electrode terminal to an electrode line of the device, and wire-bonding the other electrode line of the device to the second electrode terminal of the PCB.

In accordance with a fifth aspect of the present invention, a zener diode fabricating method comprises: sequentially forming insulation films on top and bottom of a substrate having a first polarity; etching part of a mask layer on top of the substrate to form a pair of openings through which the substrate is exposed; introducing an impurity having a second polarity opposite to that of the first polarity into the substrate and implementing a diffusing process, and forming diffusion layers having the second polarity at a substrate region exposed through a pair of openings, forming property-changed layers on top and bottom of the mask layer, and forming an insulation film on the surface of the diffusion layers; removing the property-changed layers formed on the top of the mask layer and the insulation film formed on the surface of the diffusion layers; and forming on top of the insulation film a pair of electrode lines each electrically connected to the exposed diffusion layers.

In accordance with a sixth aspect of the present invention, a zener diode comprises: a substrate having a first polarity; a diffusion layer formed from top of the substrate to an inside of the substrate and having a second polarity; a mask layer having a first opening through which the diffusion layer is exposed and a second opening through which part of the top of the substrate is exposed; a first electrode line electrically connected to the diffusion layer through the first opening, and formed on top of the mask layer; and a second electrode line electrically connected to the substrate through the second opening, and formed on the top of the mask layer.

In accordance with a seventh aspect of the present invention, a zener diode comprises: a substrate having a first polarity; a pair of diffusion layers formed from top of the substrate to an inside of the substrate, each spaced apart and having a second polarity; a mask layer having openings through which the pair of diffusion layers are exposed; and first and second electrode lines electrically connected to the diffusion layers through the openings, and formed on top of the mask layer.

BRIEF DESCRIPTION OF THE INVENTION

Preferred embodiments of the present invention will be described in detail with reference to the accompanying drawings.

DETAILED DESCRIPTION OF THE INVENTION

Hereinafter, a zener diode and methods for fabricating and packaging same according to the preferred embodiments of the present invention will be described in detail with reference to the attached drawings.

Figure 1A:
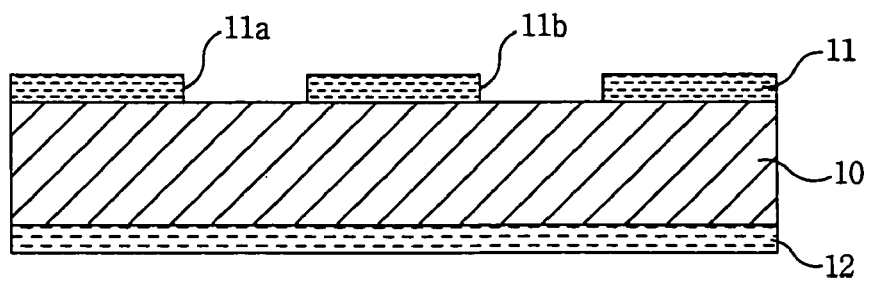
FIGS. 1a through 1e are cross-sectional views illustrating a fabricating process of a zener diode according to the prior art.
Figure 1B:
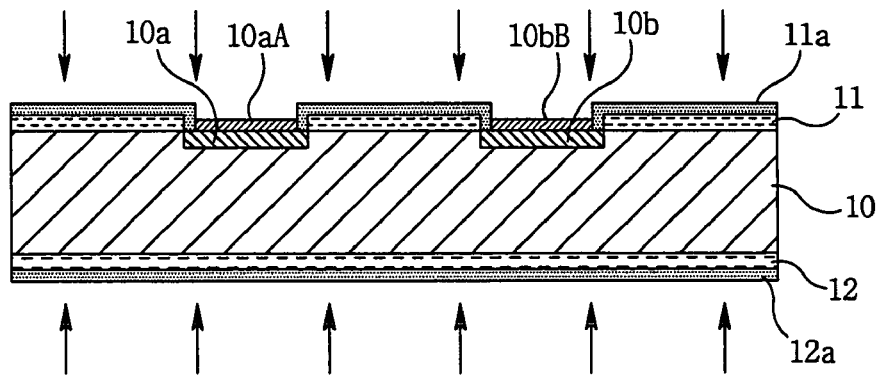
Figure 1C:
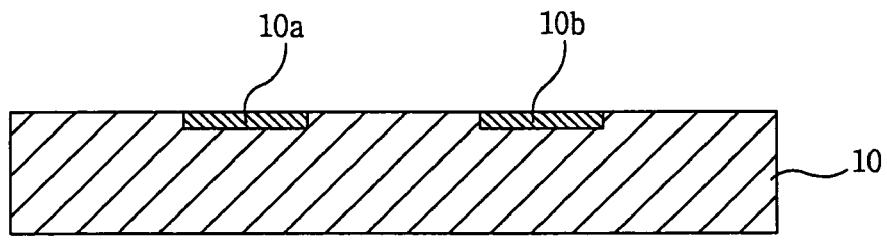
Figure 1D:
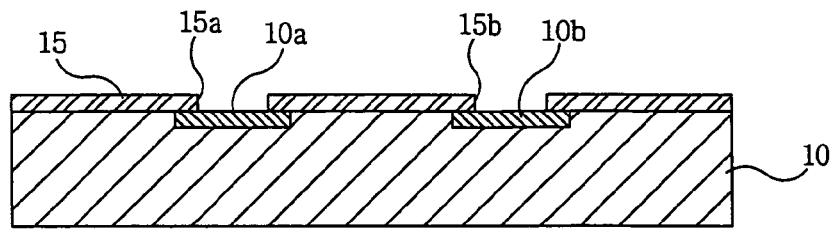
Figure 1E:
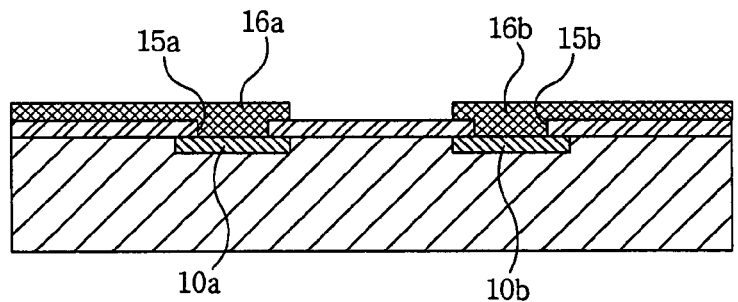
Figure 2:
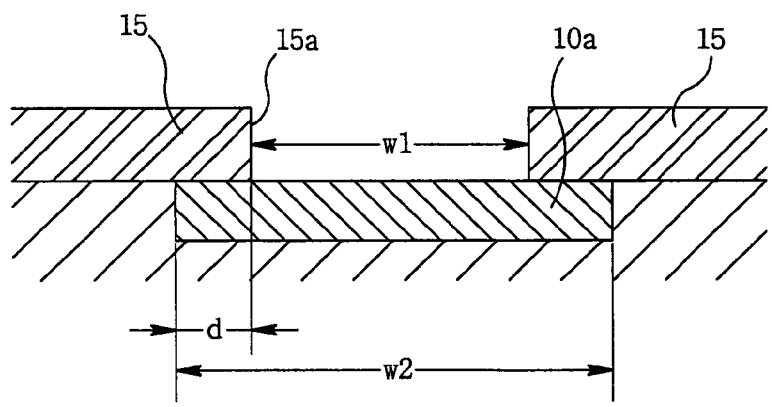
FIG. 2 is a schematic representation illustrating a phenomenon in which zener impedance value is increased according to the prior art of FIGS. 1a through 1e.
Figure 3A:
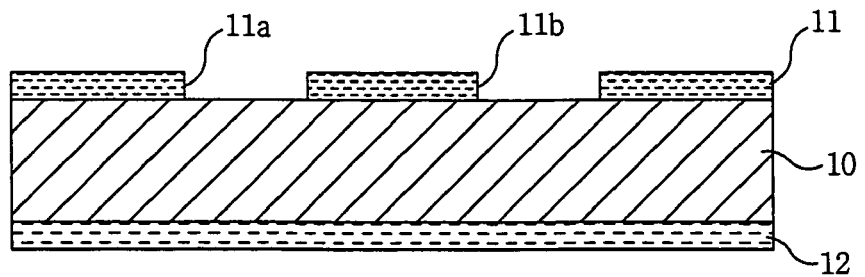
FIGS. 3a through 3d are cross-sectional views illustrating a fabricating process of a zener diode according to the prior art.
Figure 3B:
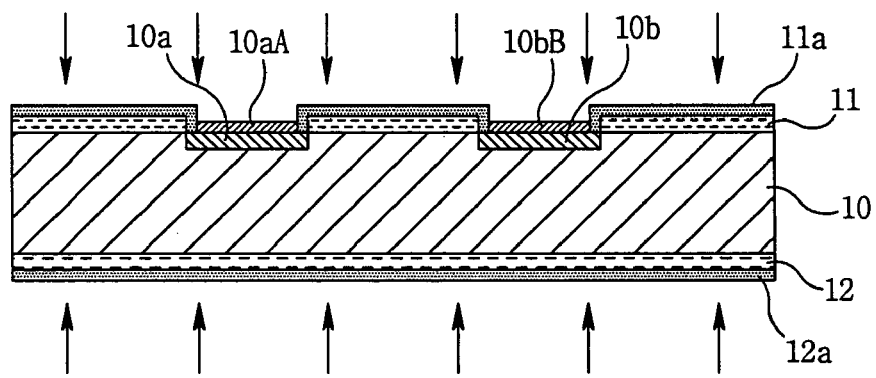
Figure 3C:
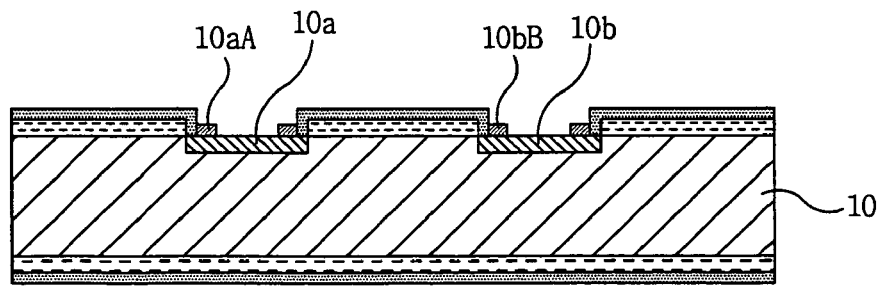
Figure 3D:
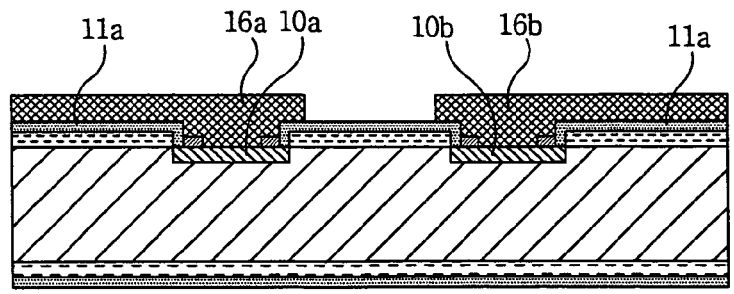
Figure 4A:
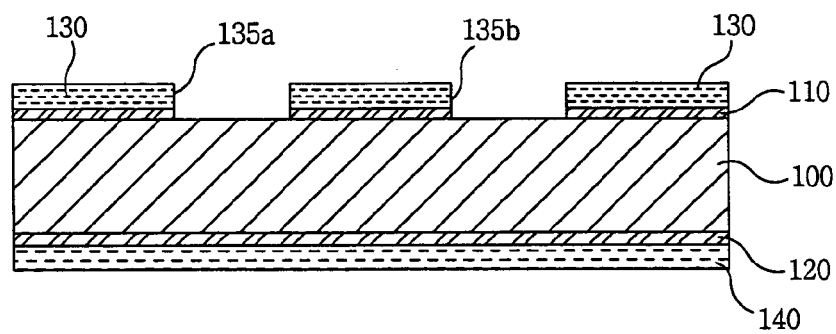
FIGS. 4a through 4d are cross-sectional views illustrating a fabricating process of a zener diode according to a first embodiment of the present invention.

FIGS. 4a through 4d are cross-sectional views illustrating a fabricating process of a zener diode according to a first embodiment of the present invention, where top and bottom insulation films (110.120) are formed on top and bottom of a substrate (100) having a first polarity, and top and bottom mask layers (130.140) are formed on top and bottom insulation layers (110.120) and etching part of the top mask layer (130) and the top insulation film (110) to form a pair of openings (135a. 135b) through which the substrate (100) is exposed. (FIG. 4a)

Preferably, the substrate (100) is silicon substrate.

Figure 4B:
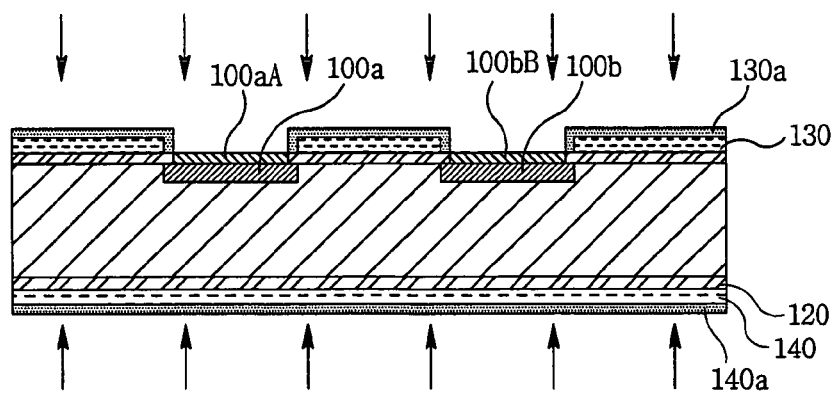

Next, a diffusion process is conducted by introducing an impurity having a second polarity opposite to that of the first polarity into the top and bottom of the substrate (100) to form diffusion layers (100a.100b) having the second polarity at the substrate (100) region exposed through the pair of openings. (FIG. 4b)

Through the diffusing process, property-changed films (130a. 130b) are formed on the top and bottom mask layers (130.140), and diffusion layers (100a.100b) are formed at surfaces thereof with insulation films (100Aa.100Bb).

Figure 4C:
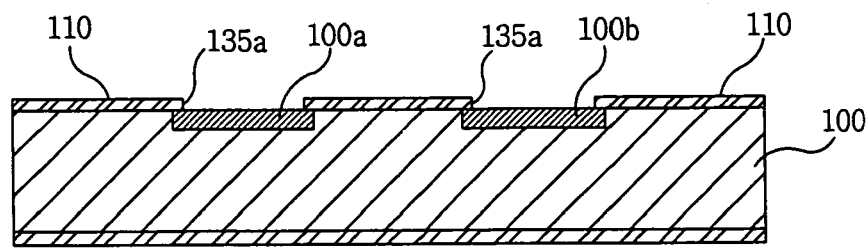

Successively, the top and bottom mask layers (130.140), the property-changed films (130a. 140a) and the insulation films (100Aa.100Bb) are removed. (FIG. 4c)

Preferably, the top and bottom mask layers (130.140), the property-changed films (130a. 140a) and the insulation films (100Aa.100Bb) are removed by wet and dry etching processes.

By the wet and dry etching processes, the substrate (100) causes the mutually separated diffusion layers (100a. 100b) to be exposed therethrough by the openings (135a. 135b) formed at the insulation film (110).

Therefore, this process is the one that removes the mask layers to expose the insulation films, and causes the mutually separated diffusion layers to be exposed through the openings of the insulation films.

In other words, the process of exposing the mutually separated diffusion layers through the openings of the insulation films denotes a process of removing the property-changed films.

Figure 4D:
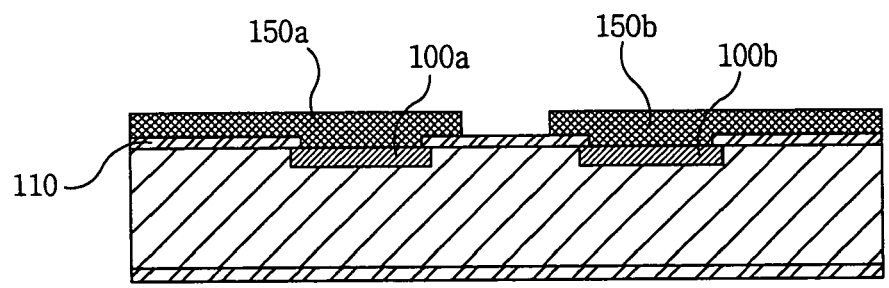

Lastly, the pair of electrode lines (150a. 150b) each electrically connected to the exposed diffusion layers (100a.100b) are formed on top of the insulation film (110). (FIG. 4d)

If the afore-mentioned first polarity is N-type, the second polarity is P type. Accordingly, if the diffusion layers are P type, the substrate is N type to thereby enable to embody a zener diode having PNP bi-directional threshold voltage characteristics.

Figure 5:
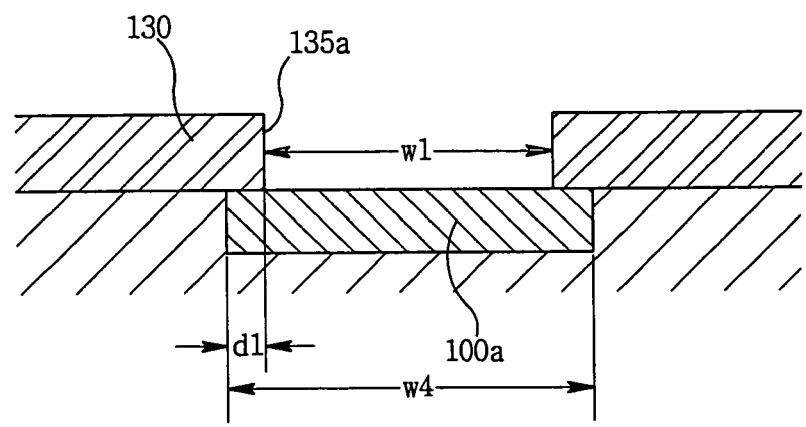
FIG. 5 is a schematic representation illustrating a concept of decreasing a zener impedance value in a zener diode according to the first embodiment of the present invention.

FIG. 5 is a schematic representation illustrating a concept of decreasing a zener impedance value in a zener diode according to the first embodiment of the present invention, where a distance (d1) from a margin of diffused width (W4) of the diffusion layer (100a) to a margin of the opening (135a) depends on crosswise diffusion from the margin of the opening (135a) formed at the insulation film (130).

Consequently, the diffusion layer according to the embodiment of the present invention has a much shorter distance than the long distance set in consideration of alignment error of contact hole formation and diffusion distribution, such that the current flow in the active layer is shortened to enable to reduce the zener impedance value.

That is, the present invention determines the length of diffusion layer not contacting the electrode line by the crosswise diffusion length out of impurity diffusion to thereby enable to reduce the zener impedance value.

Furthermore, following the diffusion, if the diffusion mask is removed by using the wet etching, no damage is inflicted on the diffusion layers to enable to improve the zener diode characteristics.

FIGS. 6a through 6e are cross-sectional views illustrating a fabricating process of a zener diode according to a second embodiment of the present invention.

Figure 6A:
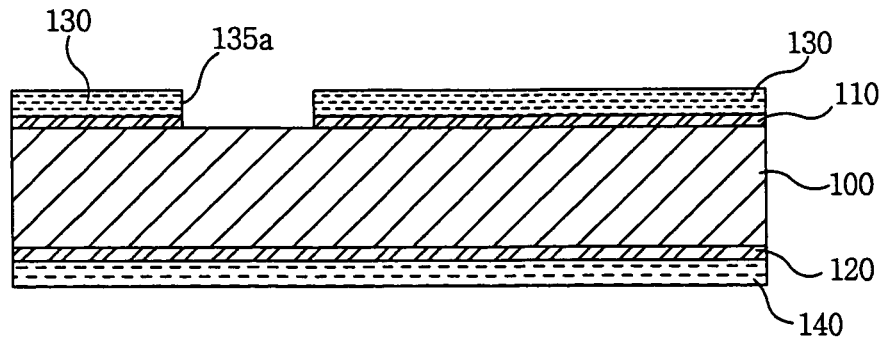
FIGS. 6a through 6e are cross-sectional views illustrating a fabricating process of a zener diode according to a second embodiment of the present invention.

First of all, top and bottom insulation films (110.120) are formed on top and bottom of a substrate (100) having a first polarity, and top and bottom insulation films (110.120) are formed thereon and thereunder with top and bottom mask layers (130.140). The top mask layer (130) and the top insulation film (110) are partially etched to form a pair of openings (135a. 135b) through which the substrate (100) is exposed. (FIG. 6a)

Figure 6B:
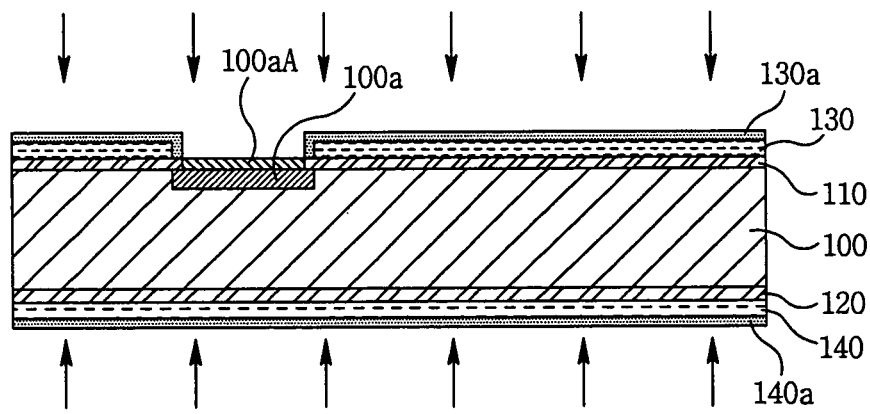

Successively, the substrate (100) is infused thereon and thereunder with impurity having a second polarity opposite to the first polarity, and diffusion process is conducted to form at the substrate (100) region a diffusion layer (100a) having the second polarity. (FIG. 6b)

Property-changed films (130a. 140a) are formed on the top and bottom mask layers (130.140) through the diffusion process as in the first embodiment of the present invention, and diffusion layer (100a) is formed at the surface thereof with an insulation film (100Aa).

Figure 6C:
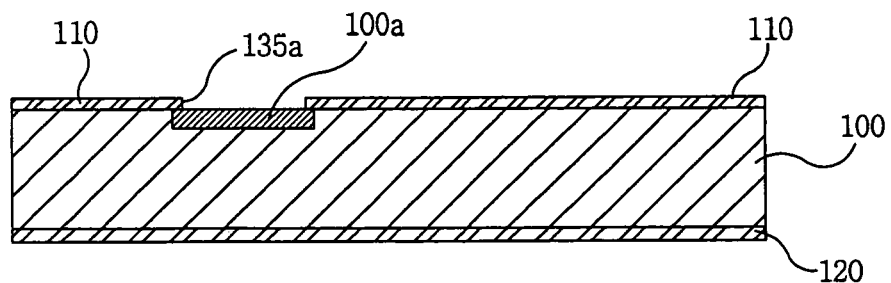

Successively, the top and bottom mask layers (130.140), the property-changed films (130a.140a) and the insulation film (100Aa) are removed. (FIG. 6c)

That is, the top and bottom mask layers (130.140) are removed to expose the insulation film (110), and the diffusion layer (100a) is exposed through the opening (135a) of the insulation film (110).

Figure 6D:
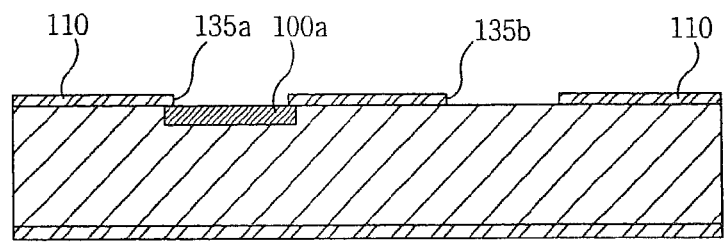

Then, the insulation film (110) region distanced from the opening (135a) is etched to form another opening (135b) through which the substrate (100) is exposed. (FIG. 6D)

Figure 6E:
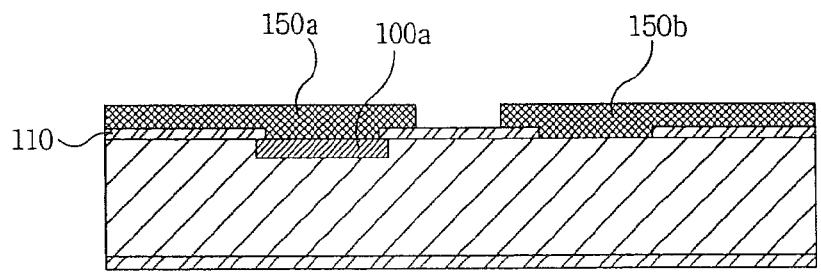

Lastly, the pair of electrode lines (150a. 150b) electrically connected to the diffusion layer (100a) exposed through the openings (135a. 135b) and the substrate (100) are formed on top of the insulation film (110). (FIG. 6e)

If the process thus described is conducted, PN or NP zener diode constituting a diffusion layer having a different polarity and a substrate can be fabricated.

Therefore, the zener diode according to the second embodiment of the present invention can be constituted comprising: a substrate having a first polarity; a diffusion layer formed inwardly into the substrate from the top of the substrate and having a second polarity; mask layers having a first opening exposing the diffusion layer and a second opening exposing part of the top of the substrate; a first electrode line electrically connected to the diffusion layer via the first opening and formed on top of the mask layers; and a second electrode line electrically connected to the substrate via the second opening and formed on the top of the mask layers.

FIGS. 7a through 7d are cross-sectional views illustrating a zener diode fabricating process according to a third embodiment of the present invention.

Figure 7A:
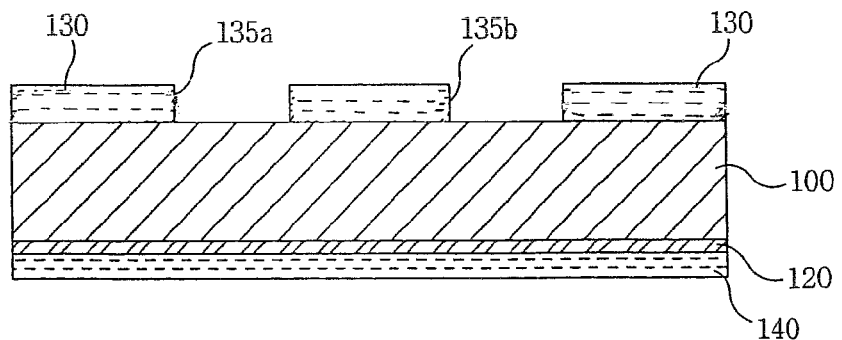
FIGS. 7a through 7d are cross-sectional views illustrating a zener diode fabricating process according to a third embodiment of the present invention.

Referring to FIG. 7a, top and bottom mask layers (130.140) are formed on top and bottom of a substrate (100) having a first polarity, and the top mask layer (130) is partially etched to form a pair of openings (135a. 135b) through which the substrate (100) is exposed.

Figure 7B:
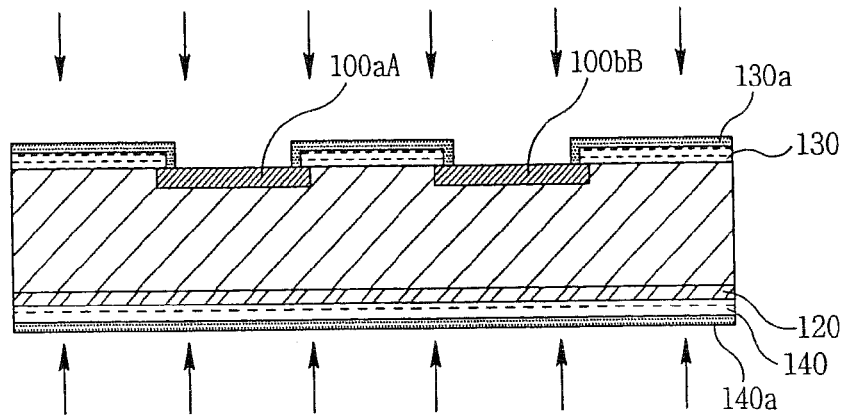

Successively, the substrate (100) is infused thereon and thereunder with impurity having a second polarity opposite to the first polarity, and diffusion process is conducted to form at the substrate (100) region exposed through the pair of openings (135a. 135b) diffusion layers (100aA, 100bB) having the second polarity. (FIG. 7b)

Property-changed films (130a. 140a) are formed on the top and bottom mask layers (130.140) through the diffusion process, and diffusion layers (100aA. 100bB) are formed at the surfaces thereof with insulation films.

Figure 7C:
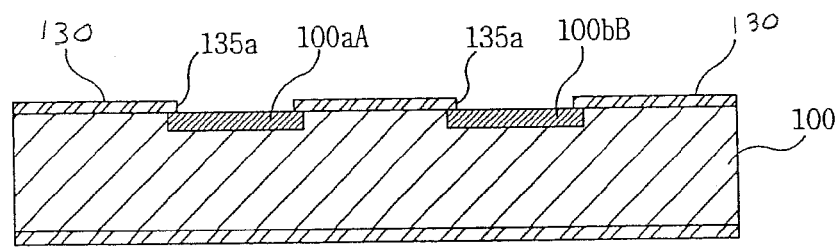

Successively, the property-changed films (130a.140a) formed on the top of the mask layer (130) and the insulation films formed on the surfaces of the diffusion layers (100aA, 100bB) are removed. (FIG. 7c)

Figure 7D:
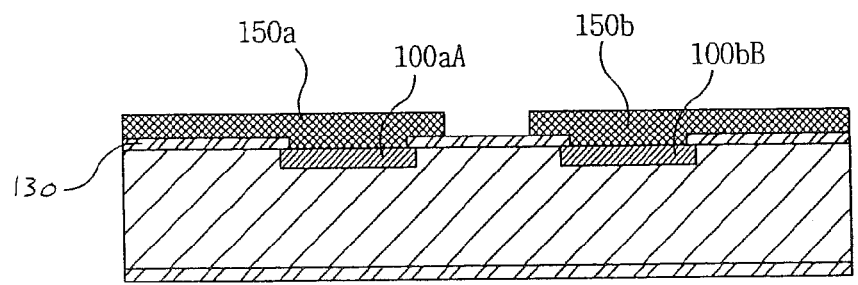

Lastly, the pair of electrode lines (150a. 150b) electrically connected to the exposed diffusion layers (100aA, 100bB) are formed on top of the top mask layer 130. (FIG. 7d)

Through this process, electrode lines are connected only to the diffusion layers, and the substrate of no diffusion is electrically insulated by the mask layer, such that the diffusion layers and the electrode lines are self-aligned to enable to improve the reliability.

Consequently, if the above-mentioned process is conducted, a zener diode can be constituted comprising: a substrate having a first polarity; a pair of diffusion layers formed inwardly into the substrate from the top of the substrate, each spaced a predetermined distance apart, and having a second polarity; a mask layer having openings exposing the diffusion layers; and first and second electrode lines electrically connected to the diffusion layers via the openings and formed on top of the mask layer.

The zener diode according to the first embodiment of the present invention may be embodied by further disposing an insulation film between the substrate and the mask layer according to the second embodiment of the present invention.

Figure 8:
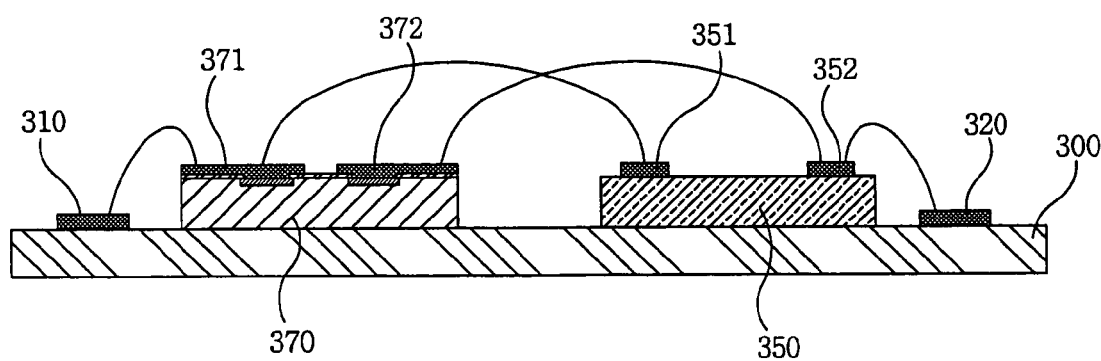
FIG. 8 is a cross-sectional view illustrating a state where a zener diode fabricated according to the embodiment of the present invention is electrically connected to a light emitting device and packaged to a printed circuit board.

FIG. 8 is a cross-sectional view illustrating a state where a zener diode fabricated according to the embodiment of the present invention is electrically connected to a light emitting device and packaged to a printed circuit board.

A Printed Circuit Board (300.PCB) is prepared, where first and second electrode terminals (310.320) are formed thereon, and a Light Emitting Device (350.LED) is packaged thereon. A zener diode (370) is packaged on top of the PCB (300). A first electrode terminal (310) of the PCB (300) and an electrode line (371) of the zener diode (370), the electrode line (371) of the zener diode (370) and an electrode terminal (351) of the LED (350), a second electrode terminal (320) of the PCB (300) and the other electrode terminal (352) of the LED (350), and the other electrode line (352) of the LED (350) and the other electrode line (372) of the zener diode (370) are wire-bonded.

Consequently, a package can be constituted by mounting an LED and a zener diode on a PCB as described earlier.

Figure 9:
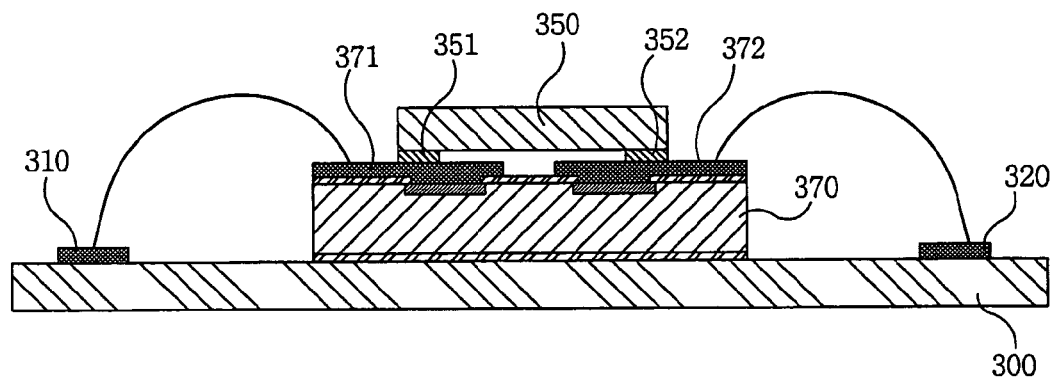
FIG. 9 is a cross-sectional view illustrating a state where a light emitting device is flip-chip bonded to top of a zener diode fabricated according to the embodiment of the present invention and packaged to a printed circuit board.

FIG. 9 is a cross-sectional view illustrating a state where a light emitting device is flip-chip bonded to top of a zener diode fabricated according to the embodiment of the present invention and packaged to a printed circuit board.

A PCB (300) formed thereon with first and second electrode terminals (310.320) is packaged with a zener diode (370), two electrode lines (371. 372) of the zener diode (370) is flip-chip bonded by LEDs (351.352), and the first electrode terminal (310) of the PCB (300) and the electrode line (371) of the zener diode (370), and the other electrode line (372) of the zener diode (370) and the second electrode terminal (320) of the PCB (300) are wire-bonded.

As described above, an LED is flip-chip bonded to top of the electrode line of the zener diode according to the first, second and third embodiments of the present invention to enable to embody a package.

As apparent from the foregoing, there is an advantage in the embodiments of the present invention thus described according to the present invention in that contact hole formation process exposing the diffusion layer is removed to enable to simplify the entire process, the diffusion length not contacting the electrode line is determined by the crosswise length toward which the impurity is diffused to enable to reduce the zener impedance value.

There is another advantage in that wet etching is used following the diffusion to remove the diffusion masks such that no damage is given to the diffusion layers to thereby enable to improve the zener diode characteristics.

There is still another advantage in that the electrode line is connected only to the diffusion layer, and a substrate of no diffusion is electrically insulated by mask layer such that the diffusion layer and the electrode line are self-aligned to thereby enable to improve the reliability of the device.

While the present invention has been described with respect to certain preferred embodiments, it will be apparent to those skilled in the art that various changes and modifications may be made without departing from the scope and spirit of the invention as defined in the following claims.

What is claimed is:

1. A zener diode fabricating method comprising:
   sequentially forming an insulation films and mask layers on top and bottom surfaces of a substrate having a first polarity;
   sequentially etching part of the mask layer and the insulation film on the top surface of the substrate to form a pair of openings through which the substrate is exposed;
   implementing a diffusion process by introducing an impurity having a second polarity opposite to that of the first polarity into the top surface of the substrate to form mutually spaced diffusion layers having the second polarity at substrate regions exposed through the pair of openings;
   removing the mask layer on the top surface of the substrate to expose the insulation film, the mutually spaced diffusion layers exposed through the openings of the insulation film; and
   forming a pair of electrode lines each electrically connected to a respective one of the exposed diffusion layers.

2. The method as defined in claim 1, wherein, by the process of forming the diffusion layers, one or more property-changed films are further formed on the mask layer on the top surface of the substrate, and additional insulation films are further formed on respective surfaces of the diffusion layers, and
   wherein the insulation film on the top surface of the substrate is exposed by removing the mask layer and the one or more property-changed films, and
   wherein the diffusion layers are exposed through the openings of the insulation film by removing the additional insulation films.

3. The method as defined in claim 1, wherein:
   the insulation film on the top surface of the substrate overlaps a first diffusion layer by a predetermined amount, and
   said predetermined amount corresponds to a distance between an edge of the first diffusion layer and an edge of an opening corresponding to the first diffusion layer, an impedance of the zener diode defined by said predetermined amount of overlap.

4. A zener diode fabricating method comprising:
   sequentially forming an insulation film and a mask layer on top and bottom surfaces of a substrate having a first polarity;
   sequentially etching part of the mask layer and the insulation film on the top surface of the substrate to form a first opening through which the substrate is exposed;
   implementing a diffusion process by introducing an impurity having a second polarity opposite to that of the first polarity into the substrate to form a diffusion layer having the second polarity at a substrate region exposed by the opening;
   removing another part of the mask layer on the top surface of the substrate to expose the insulation film, the diffusion layer exposed through the first opening of the insulation film;
   etching another part of the insulation film spaced apart from the first opening to form a second opening through which the top surface of the substrate is exposed;
   forming on top of the insulation film a pair of electrode lines each electrically connected to a respective one of the diffusion layer exposed through the first opening and the top surface of the substrate exposed through the second opening.

5. The method as defined in claim 4, wherein the method further comprises:
   forming one or more property-changed films on the mask layer on the top surface of the substrate, and
   forming an additional insulation film is further on the surface of the diffusion layer at the substrate region that corresponds to the first opening
   wherein the insulation film is exposed by removing the mask layer and the one or more property-changed films, and wherein the additional insulation film on the top of the diffusion layer is removed to expose the diffusion layer through the first opening.

6. A zener diode fabricating method comprising:
   sequentially forming insulation films on top and bottom surfaces of a substrate having a first polarity;
   etching part of a mask layer and the insulation film over the top surface of the substrate to form a pair of openings through which the substrate is exposed;
   introducing an impurity having a second polarity opposite to that of the first polarity into the substrate and implementing a diffusing process, and forming diffusion layers having the second polarity at respective substrate regions exposed through the pair of openings, forming property-changed layers on a top surface of the mask layer, and forming additional insulation films on the diffusion layers;

removing the property-changed layers formed on the top surface of the mask layer and the additional insulation films formed on the diffusion layers; and forming on top of a remaining part of the insulation film on the top surface of the substrate a pair of electrode lines each electrically connected to a respective one of the diffusion layers exposed through the pair of openings.

7. The method as defined in claim 6, wherein the substrate is a silicon substrate.

8. The method as defined in claim 6, wherein the first polarity is N type.

9. The method as defined in claim 6, wherein the first polarity is P type.

10. The method as defined in claim 9, wherein the substrate is a silicon substrate.

11. The method as defined in claim 9, wherein the first polarity is N type.

12. The method as defined in claim 9, wherein the first polarity is P type.

13. A zener diode fabricating method comprising:

sequentially forming an insulation film and a mask layer on top and bottom surfaces of a substrate having a first polarity, sequentially etching part of the mask layer and the insulation film on the top surface of the substrate to form a pair of openings through which the substrate is exposed, forming diffusion layers having a second polarity in respective substrate regions through which the openings are exposed, removing a another part of the mask layer on top surface of the substrate to expose another part of the insulation film, and forming first and second electrode lines each electrically connected to a respective one of the exposed diffusion layers to fabricate a device;

preparing a Printed Circuit Board (PCB) packaged with first and second electrode terminals thereon and a Light Emitting Device (LCD) formed thereon, bonding the device on top of the PCB;

wire-bonding a first electrode terminal of the PCB to the first one of the electrode lines of the device, wire-bonding the first one of the electrode lines of the device to a first electrode terminal of the LED, wire-bonding a second electrode terminal of the PCB to a second electrode terminal of the LED, and wire-bonding the second electrode terminal of the LED to the second one of the electrode lines of the device.

14. A zener diode packaging method comprising:

sequentially forming an insulation film and a mask layer on top and bottom surfaces of a substrate having a first polarity, sequentially etching part of the mask layer and the insulation film to form a pair of openings through which the substrate is exposed, forming diffusion layers having a second polarity on respective substrate regions through which the openings are exposed, removing another part of the mask layer on the top surface of the substrate to expose another part of the insulation film, forming first and second electrode lines each electrically connected to a respective one of the exposed diffusion layers to fabricate a device;

packaging the device to a Printed Circuit Board (PCB) formed thereon with first and second electrode terminals;

flip-chip bonding a Light Emitting Device (LED) to the first and second electrode lines of the device; and wire-bonding the first electrode terminal of the PCB to the first electrode line of the device, and wire-bonding the second electrode line of the device to the second electrode terminal of the PCB.

* * * * *